(12) United States Patent
Qiu et al.

(10) Patent No.: US 9,791,471 B2
(45) Date of Patent: Oct. 17, 2017

(54) DISPLAY PANEL INTEGRATED WITH SENSOR AND MANUFACTURING METHOD THEREOF, AND DISPLAY DEVICE

(71) Applicants: BOE Technology Group Co., Ltd., Beijing (CN); Ordos Yuansheng Optoelectronics Co., Ltd., Inner Mongolia (CN)

(72) Inventors: Yun Qiu, Beijing (CN); Jiuxia Yang, Beijing (CN); Zhidong Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/086,638

(22) Filed: Mar. 31, 2016

(65) Prior Publication Data

US 2017/0016930 A1    Jan. 19, 2017

(30) Foreign Application Priority Data

Jul. 13, 2015    (CN) .......................... 2015 1 0408594

(51) Int. Cl.
*H01J 1/62* (2006.01)
*G01P 15/08* (2006.01)
(Continued)

(52) U.S. Cl.
CPC ........ *G01P 15/0802* (2013.01); *G01P 15/125* (2013.01); *G02F 1/1339* (2013.01); *G02F 1/1368* (2013.01); *G02F 1/13439* (2013.01); *G02F 1/133345* (2013.01); *G02F 1/133512* (2013.01); *G02F 1/133514* (2013.01); *G02F 1/134309* (2013.01); *G02F 1/136209* (2013.01); *H01L 27/1248* (2013.01); *H01L 27/3225* (2013.01); *B81B 2201/0235* (2013.01); *G02F 2001/13685* (2013.01);
(Continued)

(58) Field of Classification Search
CPC ................................. B81B 2201/0235
USPC ......................... 313/505, 506, 498
See application file for complete search history.

(56) References Cited

U.S. PATENT DOCUMENTS

| 8,288,780 | B2 * | 10/2012 | Yang ................... H01L 27/3258 257/233 |
| 9,030,427 | B2 | 5/2015 | Yasumatsu |
| 2007/0170949 | A1 | 7/2007 | Pak et al. |

FOREIGN PATENT DOCUMENTS

| CN | 102667678 A | 9/2012 |
| CN | 104066040 A | 9/2014 |

OTHER PUBLICATIONS

Copy of First Office Action from Chinese Patent Application No. 201510408594.4, dated Jul. 4, 2017, 8 pages.

* cited by examiner

*Primary Examiner* — Vip Patel
(74) *Attorney, Agent, or Firm* — Westman, Champlin & Koehler, P.A.

(57) ABSTRACT

Embodiments of the invention provide a display panel and a manufacturing method thereof, and a display device comprising such a display panel. At least one sensor is integrated into the display panel through a semiconductor process that is at least partially synchronously performed with processes of forming the array substrate and/or color filter substrate of
(Continued)

the display panel, such that an integration level of the sensor on the display panel is increased and the process is simplified.

20 Claims, 6 Drawing Sheets

(51) Int. Cl.
    *G02F 1/1333*     (2006.01)
    *G02F 1/1335*     (2006.01)
    *G02F 1/1343*     (2006.01)
    *G02F 1/1368*     (2006.01)
    *G02F 1/1362*     (2006.01)
    *G02F 1/1339*     (2006.01)
    *H01L 27/32*     (2006.01)
    *H01L 27/12*     (2006.01)
    *G01P 15/125*     (2006.01)
    *H01L 29/786*     (2006.01)

(52) U.S. Cl.
    CPC ........ *H01L 27/1288* (2013.01); *H01L 27/322* (2013.01); *H01L 27/3258* (2013.01); *H01L 27/3272* (2013.01); *H01L 29/78666* (2013.01); *H01L 29/78669* (2013.01)

DISPLAY PANEL INTEGRATED WITH SENSOR AND MANUFACTURING METHOD THEREOF, AND DISPLAY DEVICE

CROSS-REFERENCE TO RELATED APPLICATION

This application claims the benefits of Chinese Patent Application No. 201510408594.4 filed on Jul. 13, 2015 in the State Intellectual Property Office of China, whole disclosures of which is incorporated herein by reference.

TECHNICAL FIELD

Embodiments of the invention generally relate to field of display technology, and specifically, to a display panel integrated with a sensor and a manufacturing method thereof, and a display device comprising such a display panel.

BACKGROUND

With development of information technology, mobile terminals such as smart phones have been widely used in people's daily lives. Currently, various applications are usually installed in a mobile terminal to meet various needs of people. For example, a mobile terminal may be provided with an acceleration sensor, which may be used in applications such as step counting, switching screen rotation direction of a display device and the like, and which may be also used for functions such as monitoring vibrations during a camera shooting; a mobile terminal may be provided with an acoustic sensor, so as to realize a speech input function of a microphone or to monitor ambient noise; or, a mobile terminal may be provided with a pressure sensor for using in applications, such as monitoring ambient pressure or height and the like.

However, existing sensors are manufactured through Micro-electromechanical Systems (MEMS) manufacturing processes and then assembled to mainboards of mobile terminals, such that they have a low integration level.

SUMMARY

The present invention has been made to overcome or alleviate at least one aspect of the above mentioned disadvantages.

Accordingly, it is an object of the present invention to provide a display panel.

In an exemplary embodiment, the display pane comprises: a first substrate; a second substrate disposed facing the first substrate; and at least one sensor integrated between the first substrate and the second substrate.

In an embodiment, the sensor may comprises an acceleration sensor, and the acceleration sensor may comprise: a first electrode formed on the first substrate; a second electrode formed on the second substrate; an enclosing wall disposed between the first substrate and the second substrate, an enclosed cavity being defined by the enclosing wall, the first electrode and the second electrode; a mass block disposed in the enclosed cavity to divide the enclosed cavity into a first cavity and a second cavity that are isolated from each other, the mass block being able to move between the first substrate and the second substrate along the enclosing wall to change volumes of the first cavity and the second cavity; and a first fluid and a second fluid filled in the first cavity and the second cavity respectively, so as to allow the mass block to move freely within the enclosed cavity.

In an embodiment, the display panel may be a liquid crystal display (LCD) panel comprising a pixel electrode formed on the first substrate and a common electrode formed on the second substrate, the first electrode and the pixel electrode being formed by the same electrically conductive layer, and the second electrode and the common electrode being formed by the same electrically conductive layer; alternatively, the display panel may be an organic light-emitting diode (OLED) display panel comprising an anode formed on the first substrate and a cathode formed close to the second substrate, the first electrode and the anode being formed by the same electrically conductive layer, and the second electrode and the cathode being formed by the same electrically conductive layer.

In an embodiment, an inner surface of the enclosing wall may be provided with a guiding rail, and the mass block is configured to be movable within the enclosed cavity along the guiding rail.

In an embodiment, at least one of the enclosing wall and the mass block may be provided with a position detecting structure for detecting a position of the mass block within the enclosed cavity.

In an embodiment, the sensor may comprise a pressure sensor comprising a first electrode formed on the first substrate, a second electrode facing the first electrode and a partition wall disposed between the first electrode and the second electrode; at least one enclosed microcavity is defined by the first electrode, the second electrode, and the partition wall; and at least one of the first electrode and the second electrode is formed of graphene.

In an embodiment, the display panel may further comprise a metallic light-shielding layer formed on the first substrate and a buffer layer covering the metallic light-shielding layer; the first electrode is formed of graphene; the second electrode and the metallic light-shielding layer are formed by a some material layer; and the partition wall is formed by a material layer forming the buffer layer.

In an embodiment, the display panel may further comprise a TFT structure formed on the first substrate and one or more insulating material layers covering the TFT structure; the partition wall is formed by at least one insulating material layer of the one or more insulating material layers.

In an embodiment, the one or more insulating material layers may comprise at least one of an interlayer insulating layer, a protective passivation layer and a planarization layer.

In an embodiment, the display panel may further comprise a color filter layer and a black matrix layer formed on the second substrate, and the pressure sensor is located between the second substrate and the color filter layer and between the second substrate and the black matrix layer.

In an embodiment, the partition wall may be formed of a photoresist material through a patterning process.

In an embodiment, the partition wall may be formed by one or more of material layers forming the color filter layer and the black matrix layer through a patterning process.

In an embodiment, the display panel may further comprise a common electrode covering the color filter layer and the black matrix layer, the first electrode being formed on a surface of the second substrate, the second electrode being electrically insulated from the common electrode by an insulating layer formed by one or more of materials forming the color filter layer and the black matrix layer.

In an embodiment, the display panel may further comprise a common electrode covering the color filter layer and the black matrix layer, the first electrode being formed on a surface of the second substrate, and the second electrode and the common electrode being formed by the same electrically conductive layer.

In an embodiment, the sensor may comprise an acoustic sensor comprising a first electrode formed on the first substrate, a second electrode facing the first electrode, a back cavity located between the first electrode and the second electrode, a microhole penetrating through the first substrate and communicating the back cavity with external environment, and an acoustic sensitive structure arranged on the second electrode, the acoustic sensitive structure being at least partially made from silicon.

In an embodiment, the display panel may further comprise a metallic light-shielding layer formed on the first substrate and a top-gate type TFT structure formed on the metallic light-shielding layer, wherein top-gate type TFT structure comprises a semiconductor material layer, a gate insulating layer and a gate that are formed successively on the metallic light-shielding layer, and wherein the first electrode and the metallic light-shielding layer are formed by the same material layer, the semiconductor material layer and the gate insulating layer further cover the first electrode successively and at least a portion of the gate insulating layer faces the inside of the back cavity, and the second electrode and the gate are formed by the same material layer.

In an embodiment, the display panel may further comprise a bottom-gate type TFT structure formed on the first substrate, the bottom-gate type TFT structure comprising a gate, a gate insulating layer, semiconductor material layer and a source/drain electrode layer that are formed successively on the first substrate; the first electrode and the gate are formed by the same material layer, the semiconductor material layer further covers the first electrode, and the second electrode and the source/drain electrode layer are formed by the same material layer.

In an embodiment, the acoustic sensitive structure may comprise an upper insulating material layer, a lower insulating material layer facing the upper insulating material layer, and a silicon layer sandwiched between the upper insulating material layer and the lower insulating material layer.

In an embodiment, the display panel may further comprise a cavity wall located between the first electrode and the second electrode, the back cavity being defined by the cavity wall, the first electrode and the second electrode, the cavity wall being at least partially formed of silicon.

According to another aspect of the invention, there is provided a display device, which comprises the display panel according to any one of the above embodiments.

According to a further aspect of the invention, there is provided a method of manufacturing a display panel integrated with an acceleration sensor.

In an embodiment, the method may comprise steps of:
providing a first substrate;
forming a TFT structure and a first electrode on the first substrate;
forming an enclosing wall on the first substrate, such that a space having an upper opening is defined by the enclosing wall and the first electrode;
filling a first fluid into the space to fill a portion of the space;
disposing a mass block within the space to contact and seal the first fluid;
providing a second substrate;
forming a second electrode on the second substrate;
assembling and sealing the first substrate and the second substrate in a manner of the first electrode and the second electrode being disposed face-to-face, such that the enclosing wall, the first electrode and the second electrode together define an enclosed cavity, the mass block dividing the enclosed cavity into a first cavity and a second cavity isolated from each other, the first fluid being filled within the first cavity; and
filling a second fluid into the second cavity and sealing the second cavity, the first fluid and the second fluid enabling the mass block to move freely between the first substrate and the second substrate along the enclosing wall during an acceleration movement so as to change volumes of the first cavity and the second cavity.

According to a still further aspect of the invention, there is provided a method of manufacturing a display panel integrated with a pressure sensor.

In an embodiment, the method may comprise steps of: providing a first substrate and a second substrate that are disposed face-to-face; and forming the pressure sensor between the first substrate and the second substrate through a semiconductor process, wherein the step of forming the pressure sensor comprises forming a first electrode, a plurality of partition walls and a second electrode successively on the first substrate or the second substrate, such that at least one enclosed microcavity is formed between the first electrode and the second electrode, and wherein at least one of the first electrode and the second electrode is formed of graphene.

According to a still further aspect of the invention, there is provided a method of manufacturing a display panel integrated with an acoustic sensor.

In an embodiment, the method may comprises steps of: providing a substrate; and forming a TFT structure and the acoustic sensor on the substrate through a semiconductor process, wherein the acoustic sensor comprises a first electrode, a second electrode, a back cavity located between the first electrode and the second electrode, a microhole penetrating through the substrate and communicating the back cavity with external environment, and an acoustic sensitive structure arranged on the second electrode, the acoustic sensitive structure being at least partially made from silicon.

Other objects and advantages of the invention will be apparent with detailed description set forth in conjunction with the accompanying drawings hereinafter, which will also help those skilled in the art to have a thorough understanding of the embodiments of the invention.

BRIEF DESCRIPTION OF THE DRAWINGS

The above and other features of embodiments of the present invention will become more apparent by describing in detail exemplary embodiments thereof with reference to the accompanying drawings, which shall not be construed as any limitations to the embodiments of the invention, and in which.

DETAILED DESCRIPTION OF PREFERRED EMBODIMENTS

Figure 1:
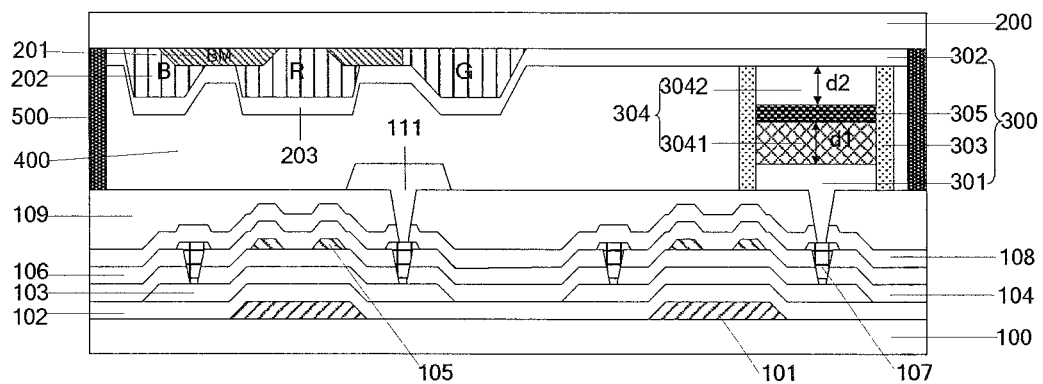
FIG. 1 is an illustrative structural drawing showing a display panel integrated with an acceleration sensor according to a first exemplary embodiment of the invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein. Rather, these embodiments are provided so that the present disclosure will be thorough and complete, and will fully convey the concept of the disclosure to those skilled in the art. Obviously, however, one or more embodiments can also be implemented without those specific details. In other conditions, well-known structures and devices are schematically illustrated so as to simplify the drawings.

According to a general concept, there is provided a display panel and a manufacturing method thereof, and a display device comprising such display panel. The display panel comprises a substrate and at least one sensor, the sensor is integrated in the display panel through a process that is performed at least partially simultaneously with a process for forming an array substrate and/or color filter substrate of the display panel, so that an integration level of the sensor can be improved and processes of forming the display panel are simplified.

According to embodiments of the invention, the above sensor may comprise various different sensors, such as an acceleration sensor, an acoustic sensor, a pressure sensor and the like; the display panel may be a liquid crystal display (LCD) panel, or an organic light-emitting diode (OLED) panel. Structures of display panels integrated with different types of sensors and manufacturing methods thereof will be described hereinafter in conjunction with exemplary embodiments.

Figure 2:
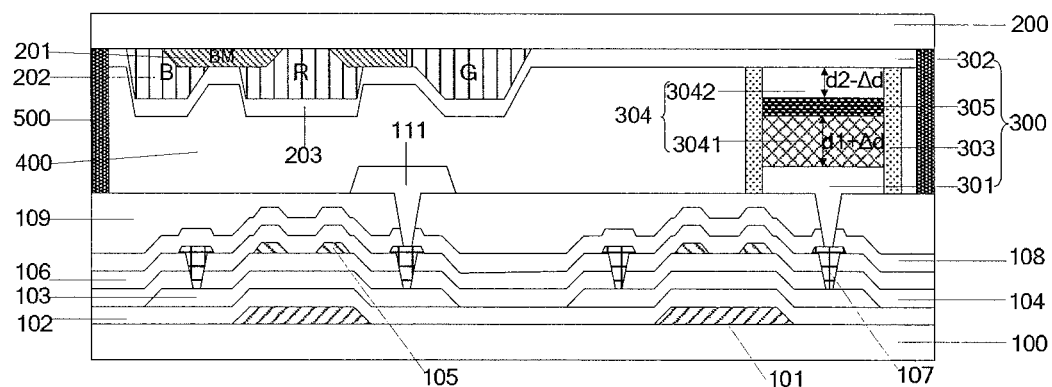
FIG. 2 is an illustrative structural drawing showing a display panel integrated with an acceleration sensor according to a second exemplary embodiment of the invention.
Figure 3:
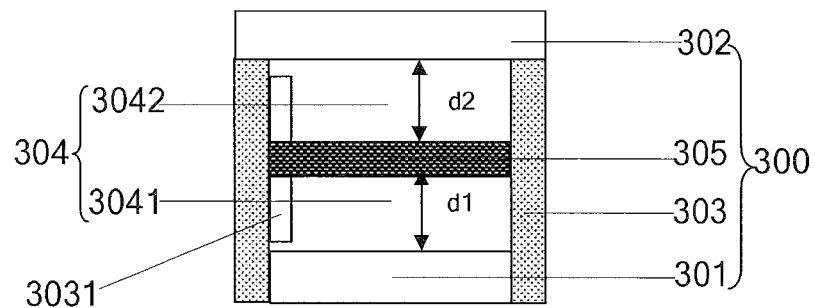
FIG. 3 is a schematic drawing showing an acceleration sensor, which is in a balanced state, according to the first exemplary embodiment of the invention.
Figure 4:
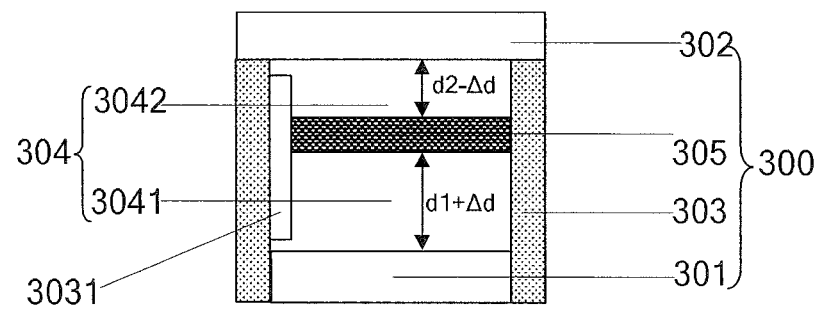
FIG. 4 is a schematic drawing showing an acceleration sensor, which is in a working state, according to the second exemplary embodiment of the invention.

Each of FIGS. 1 and 2 shows an illustrative arrangement of a display panel integrated with an acceleration sensor; and FIGS. 3 and 4 show a structure of an acceleration sensor in a balanced state and in a working state, respectively. As shown in the figures, a display panel comprises: a first substrate 100 and a second substrate 200 arranged facing each other; and an acceleration sensor 300 formed between the first substrate 100 and the second substrate 200. The acceleration sensor may be used to sense an acceleration of the display panel.

In an example, the acceleration sensor 300 may be a capacitive acceleration sensor. As shown in FIGS. 1 to 4, the acceleration sensor 300 comprises: a first electrode 301 formed on the first substrate 100; a second electrode 302 formed on the second substrate 200; an enclosing wall 303 formed between the first electrode 301 and the second electrode 302, an enclosed cavity 304 being defined by the enclosing wall 303, the first electrode 301 and the second electrode 302; a mass block 305 disposed within the enclosed cavity 304 such that the enclosed cavity is divided into a first cavity 3041 and a second cavity 3042 that are hermetically isolated from each other and the mass block may move between the first substrate 100 and the second substrate 200 along the enclosing wall 303 to change volumes of the first cavity 3041 and the second cavity 3042 in response to a movement of the display panel; and a first fluid and a second fluid filled in the first cavity 3041 and the second cavity 3042 respectively so as to allow the mass block 305 to move freely within the enclosed cavity 304 in response to the movement of the display panel.

In the embodiments shown in FIGS. 1 and 2, the display panel is a LCD display panel, the first substrate 100 is an array substrate, the second substrate 200 is a color filter substrate, and the display panel comprises at least one pixel electrode 111 formed on the first substrate and a common electrode 203 formed on the second substrate 200. In one example, the first electrode 301 may be formed in the same layer as the pixel electrode 111, or they may be formed by the same electrically conductive layer simultaneously; and/or the second electrode 302 may be formed in the same layer as the common electrode 203, or they may be formed by the same electrically conductive layer simultaneously.

If the display panel is an OLED display panel (not shown in FIGS. 1 and 2), it may comprise a thin-film transistor (TFT) array substrate, an enclosing substrate and a TFT structure; the TFT structure may comprise an anode disposed at a side close to the array substrate, a cathode disposed at a side close to the enclosing substrate and a light-emitting layer between the anode and the cathode; the first electrode of the acceleration sensor may be formed in the same layer as the anode or they may be formed by the same electrically conductive layer simultaneously, and the second electrode of the acceleration sensor may be formed in the same layer as the cathode or they may be formed by the same electrically conductive layer simultaneously.

In an example, a guiding rail (not shown) may be disposed in or on an inner surface of the enclosing wall 303 of the acceleration sensor 300, and the mass block 305 is configured to be able of moving along the guiding rail inside the enclosed cavity 304.

In an embodiment of the invention, the array substrate and the color filter substrate may utilize existing structures. Exemplarily, as shown in FIGS. 1 and 2, a metallic light-shielding layer 101, a buffer layer 102, a semiconductor material layer 103, a gate insulating layer 104, a gate 105, an interlayer insulating layer 106, a source/drain electrode layer 107, a protective passivation layer 108 and a planarization layer 109 may be formed successively on the first substrate 100; the semiconductor material layer 103, the gate insulating layer 104, the gate 105, the interlayer insulating layer 106 and the source/drain electrode layer 107 may constitute a TFT structure; the pixel electrode 111 is formed on the planarization layer 109 and electrically connected with a drain electrode of the TFT structure; a black matrix 201, a color filter layer 202 and the common electrode 203 may be formed successively on the second substrate 200; a liquid crystal layer 400 is arranged between the first and the second substrates and sealed between the common electrode 203 and the pixel electrode 111 by sealant 500.

FIG. 3 shows that the acceleration sensor 300 is in the balanced state, wherein the mass block 305 inside the enclosed cavity 304 is supported by fluids at both sides thereof, such that the mass block is located at a balanced position or neutral position. At this time, a distance between the mass block 305 and the first electrode 301 is d1, a distance between the mass block 305 and the second electrode 302 is d2. FIG. 4 shows that the acceleration sensor 300 is in the working state. When an electronic device provided with the above described display panel, for example, a mobile terminal such as an intelligent mobile phone, is moving, the mass block 305 within the enclosing cavity 304 of the acceleration sensor may move within the cavity in response to the movement of the electronic device. At this time, as shown in FIG. 4, the distance between the mass block 305 and the first electrode 301 has been changed to d1+Δd, and the distance between the mass block 305 and the second electrode 302 has been changed to d2−Δd, causing variations in the volumes of the first cavity 3041 and the second cavity 3042 separated by the mass block 305. Variations in capacitances of the two cavities can be calculated based on relative variation in volume of the two cavities, and a corresponding value of acceleration can be calculated based on the variations in capacitances, and the value is finally output in form of electric signal(s).

In another example, at least one of the enclosing wall and the mass block of the acceleration sensor is provided with a position detecting structure (or component) for detecting a position of the mass block within the enclosed cavity. As shown in FIGS. 3 and 4, a position detecting structure 3031 is formed on the enclosing wall 303, and it may be an electrically conductive structure formed of an electrically conductive material, such as nanowire(s), carbon nanotube(s), silver paste or the like; alternatively, the position detecting structure may be formed of an electrically conductive material, such as electrically conductive gold spherical particles, doped in the material of the enclosing wall. Exemplarily, through detecting a variation in electrical properties of the position detecting structure or through cooperation between the position detecting structure and other electrically conductive structures, a relative position or state of the mass block within the enclosing cavity can be determined, and in turn, the variations in volumes can be determined.

According to an exemplary embodiment of the invention, a method of manufacturing the above display panel integrated with an acceleration sensor is provided. With reference to FIGS. 1 to 4, the method may comprise the following steps:

providing the first substrate 100;

forming the TFT structure and the first electrode 301 on the first substrate 100;

forming the enclosing wall 303 on the first substrate 100, a space having an upper opening being defined by the enclosing wall 303 and the first electrode 301;

filling the first fluid to fill a portion of the space, such as the above first cavity 3042;

disposing the mass block 305 within the space to contact and seal the first fluid;

providing the second substrate 200;

forming the second electrode 302 on the second substrate 200;

assembling and sealing the first substrate 100 and the second substrate 200 in a manner of the first electrode 301 and the second electrode 302 being disposed face-to-face, such that the enclosing wall 303, the first electrode 301 and the second electrode 302 together define the enclosed cavity 304, the mass block 305 dividing the enclosed cavity 304 into the first cavity 3041 and the second cavity 3042 isolated from each other, the first fluid being filled within the first cavity 3041; and filling the second fluid into the second cavity 3042 and sealing the second cavity 3042, the first fluid and the second fluid enabling the mass block 305 to move freely between the first substrate 100 and the second substrate 200 along the enclosing wall 303 when influenced by an acceleration so as to change the volumes of the first cavity 3041 and the second cavity 3042.

In an example, the pixel electrode 111 or the anode electrically connected with the source or drain electrode of the TFT structure and the first electrode 301 may be formed of the same electrically conductive material simultaneously on the first substrate 100; and/or, the common electrode 203 or the cathode of the display panel and the second electrode 302 may be formed of the same electrically conductive material simultaneously on the second substrate 200.

In an example, the enclosing wall 303 may be formed of a photoresist material through a patterning process. For example, the enclosing wall 303 and the sealant 500 may be formed of the same material simultaneously. In another example, the mass block 305 may be preformed of a material such as silicon, quartz or the like, and then installed within the cavity 304. In a further example, the first and the second fluids may comprise a material having a low viscosity or substantially no viscosity. For example, the first fluid may be a superfluid material, while the second fluid may be nitrogen gas.

Figure 5:
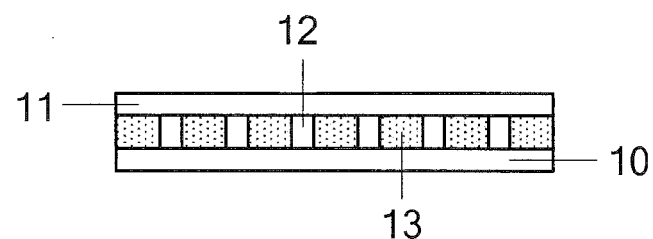
FIG. 5 is a schematic drawing showing a basic structure of a pressure sensor that may be used in a display panel according to embodiments of the invention.

According to another aspect of the invention, a pressure sensor may be integrated into the display panel through semiconductor technology. FIG. 5 shows a basic structure of a pressure sensor according to an exemplary embodiment of the invention, and each of FIGS. 6 to 12 shows a configuration of a display panel integrated with a pressure sensor according to exemplary embodiments of the invention.

As shown in FIG. 5, a pressure sensor mainly comprises a first electrode 10, a second electrode 11, partition wall(s) between the first electrode and the second electrode, and at least one tightly enclosed microcavity 12 formed by the first electrode 10, the second electrode 11 and the partition wall. The pressure sensor may be used to detect a pressure applied on the display panel.

In a preferable example, at least one of the first electrode 10 and the second electrode 11 may be formed of graphene. Alternatively, one of the first electrode 10 and the second electrode 11 is formed of graphene, and the other one is formed of a suitable electrically conductive material, such as carbon nanotubes(s), indium tin oxide (ITO) or the like. In the pressure sensor having such a configuration, the electrode formed of graphene is used as a pressure sensitive structure (or component) of the pressure sensor, and the other electrode is used as an electric signal sampling component of the pressure sensor. When a pressure is applied on a surface of the display panel and in turn applied on a layer of graphene, a distance between the first and the second electrode changes, such that a capacitance therebetween changes, and a value of the pressure can be calculated based on the change of the capacitance.

Figure 6:
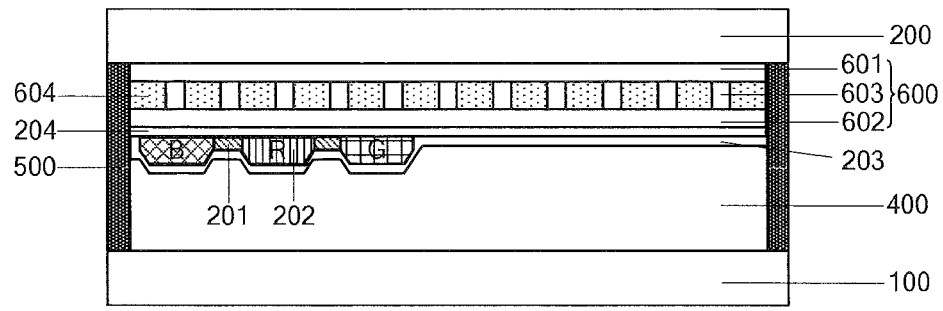
FIG. 6 is an illustrative structural drawing showing a display panel integrated with a pressure sensor according to a third exemplary embodiment of the invention.

FIG. 6 shows a structure of a display panel integrated with a pressure sensor according to a third exemplary embodiment of the invention. As shown in the figure, the display panel is a LCD display panel comprising: the first substrate 100, the second substrate 200, and a pressure sensor 600 integrated on the second substrate 200, wherein the first substrate 100 and the second substrate 200 are assembled and sealed by sealant 500, so as to enclose a liquid crystal layer 400 between the first substrate 100 and the second substrate 200. It can be understood that, in the case that the display panel is an OLED display panel, the pressure sensor may be integrated on the TFT array substrate or an enclosing cover plate of the OLED display panel.

The pressure sensor 600 has a similar structure as that of the pressure sensor shown in FIG. 5, and comprises a first electrode 601, a second electrode 602, and at least one microcavity 603 between the first electrode 601 and the second electrode 602. Adjacent microcavities 603 may be separated by a cavity wall or partition wall 604 disposed between the first electrode 601 and the second electrode 602. Preferably, at least one of the first electrode 601 and the second electrode 602 is formed of graphene.

In the embodiment shown in FIG. 6, the display panel further comprises a black matrix layer 201 and a color filter layer 202 formed on the second substrate 200, and a common electrode 203 covering over the black matrix layer 201 and the color filter layer 202. The pressure sensor 600 is located between a surface of the second substrate 200 and the black matrix layer 201 and between a surface of the second substrate 200 and the color filter layer 202, and substantially occupies the entire screen region of the display panel. As shown in FIG. 6, an insulating layer 204 is provided between the second electrode 602 of the pressure sensor 600 and the common electrode 203, so as to electrically insulate the second electrode 602 and the common electrode 203. Of course, it is possible that no insulating layer is provided between the second electrode of the pressure sensor and the common electrode, and the second electrode and the common electrode can contact with each other or share the same electrode, as shown in FIGS. 8-11; in this condition, the contacted electrodes or the shared electrode may be controlled through time division multiplexing, so as to realize the function of the second electrode of the pressure sensor and the function of the common electrode of the display panel, i.e., to realize the function of display and the function pressure detection, respectively.

In an example, the cavity wall or partition wall 604 is formed of a resin material or photoresist material through a patterning process. Alternatively, the cavity wall or partition wall 604 is formed of a material that is one or more of the materials for forming the black matrix layer 201 and the color filter layer 202 through a patterning process, and/or the insulating layer 204 may also be formed of a material that is one or more of the materials for forming the black matrix layer 201 and the color filter layer 202 through a patterning process, as shown in FIGS. 7-11.

In the embodiments shown in FIGS. 7-11, same or similar structures or parts as those shown in FIG. 6 are indicated by same or similar reference numerals. Hereinafter, only differences between the embodiments shown in FIGS. 7-11 and the embodiment shown in FIG. 6 will be described.

Figure 7:
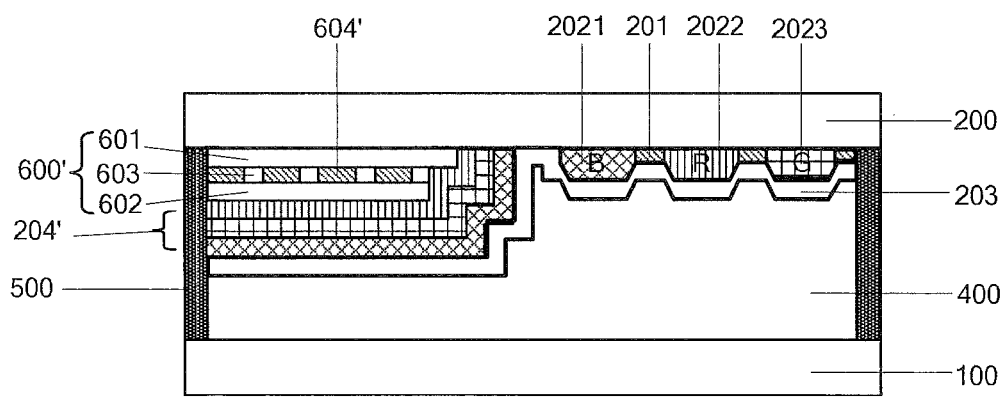
FIG. 7 is an illustrative structural drawing showing a display panel integrated with a pressure sensor according to a fourth exemplary embodiment of the invention.

In the embodiment shown in FIG. 7, a pressure sensor 600' is integrated on the second substrate 200, occupying a part of the screen of the display panel; the color filter layer 202 comprises a blue filter pattern 2021, a red filter pattern 2022 and a green filter pattern 2023; the cavity wall or partition wall 604' separating the microcavities 603 is formed of a material used to form the black matrix layer 201, that is, the cavity wall or partition wall 604' and the black matrix layer 201 may be formed of the same material simultaneously; additionally, the insulating layer 204' electrically insulating the second electrode 602 and the common electrode 203 is formed by overlapping material layers that form the blue filter pattern 2021, the red filter pattern 2022 and the green filter pattern 2023.

Figure 8:
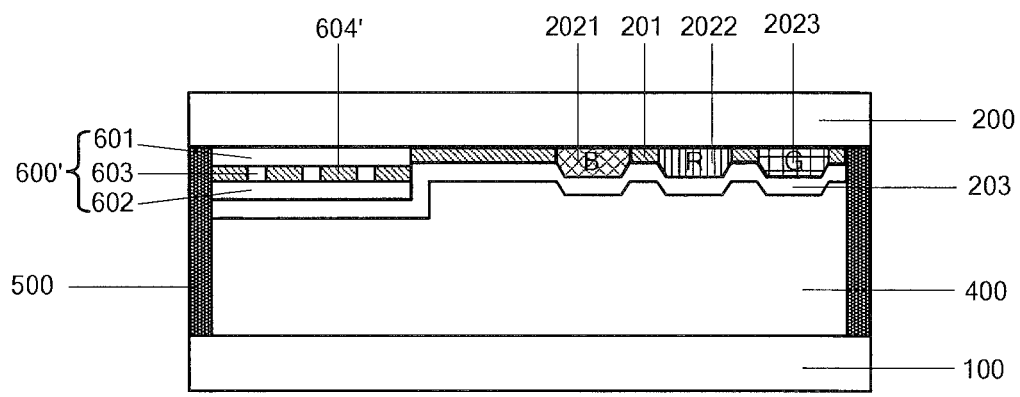
FIG. 8 is an illustrative structural drawing showing a display panel integrated with a pressure sensor according to a fifth exemplary embodiment of the invention.

In the embodiment shown in FIG. 8, the pressure sensor 600' is integrated on the second substrate 200, occupying a part of the screen; the cavity wall or partition wall 604' separating the microcavities 603 is formed of a material used to form the black matrix layer 201; additionally, the second electrode 602 and the common electrode 203 directly contact and overlap with each other, and the two electrodes may be controlled through time division multiplexing.

Figure 9:
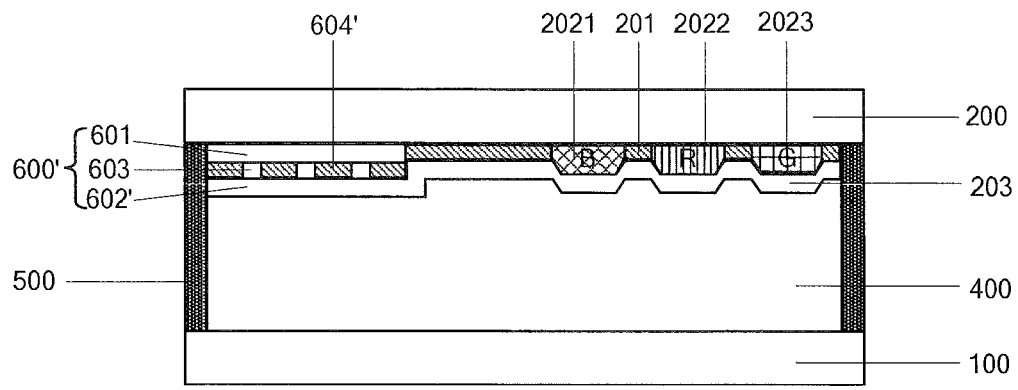
FIG. 9 is an illustrative structural drawing showing a display panel integrated with a pressure sensor according to a sixth exemplary embodiment of the invention.

In the embodiment shown in FIG. 9, a pressure sensor 600' is integrated on the second substrate 200, occupying a part of the screen; the cavity wall or partition wall 604' separating the microcavities 603 is formed of a material used to form the black matrix layer 201; additionally, the second electrode 602' and the common electrode 203 share the same electrode, that is, a portion of the common electrode 203 located within a region where the pressure sensor 600' lies is used as the second electrode 602', and the common electrode may be controlled through time division multiplexing.

Figure 10:
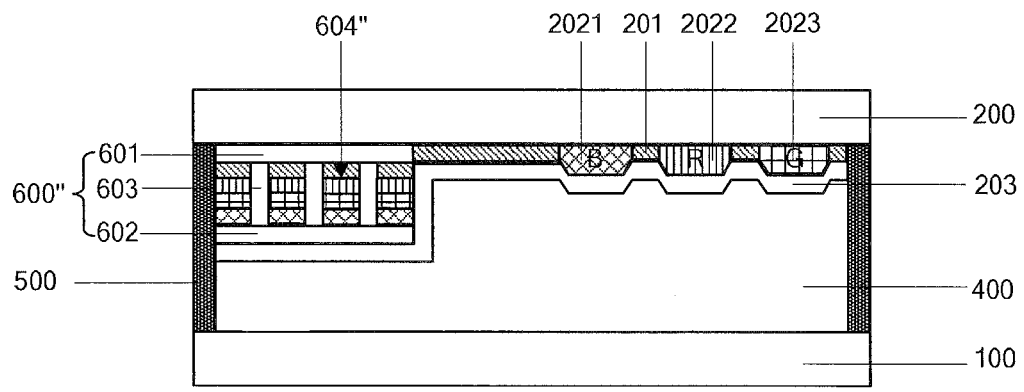
FIG. 10 is an illustrative structural drawing showing a display panel integrated with a pressure sensor according to a seventh exemplary embodiment of the invention.

In the embodiment shown in FIG. 10, a pressure sensor 600" is integrated on the second substrate 200, occupying a part of the screen; the cavity wall or partition wall 604" separating the microcavities 603 is formed by overlapping the material layers that form the black matrix layer 201 and the color filter layer 202 (comprising the blue filter pattern 2021, the red filter pattern 2022 and the green filter pattern 2023); additionally, the second electrode 602 and the common electrode 203 directly contact and overlap with each other, and the common electrode may be controlled through time division multiplexing.

Figure 11:
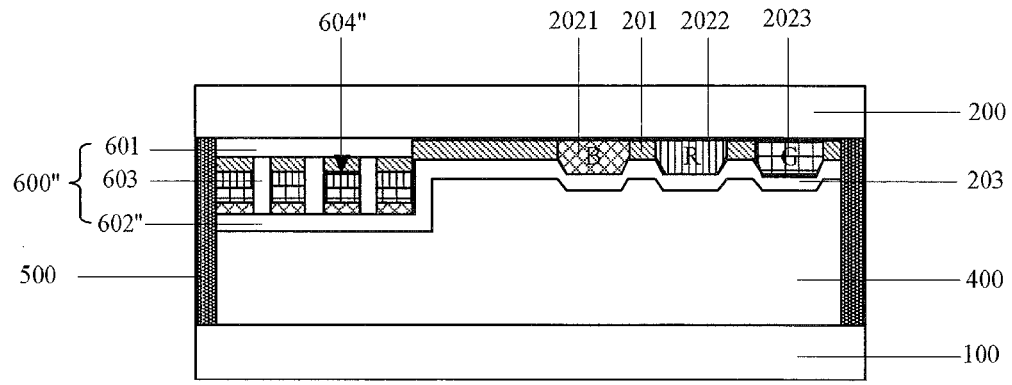
FIG. 11 is an illustrative structural drawing showing a display panel integrated with a pressure sensor according to an eighth exemplary embodiment of the invention.

In the embodiment shown in FIG. 11, the pressure sensor 600" is integrated on the second substrate 200, occupying a part of the screen; the cavity wall or partition wall 604" separating the microcavities 603 is formed by overlapping the material layers that form the black matrix layer 201 and the color filter layer 202 (comprising the blue filter pattern 2021, the red filter pattern 2022 and the green filter pattern 2023); additionally, the second electrode 602" and the common electrode 203 share the same electrode, that is, a portion of the common electrode 203 located within a region where the pressure sensor 600" lies is used as the second electrode 602", and the common electrode may be controlled through time division multiplexing.

It can be understood that, the first electrode and the second electrode of the pressure sensor, the cavity wall or the partition wall and/or the insulating layer may be formed of material layers of other components of the display panel and their various combinations, so as to simplify the process. Of course, separate and suitable materials may be used to form the first electrode and the second electrode of the pressure sensor, the cavity wall or the partition wall and/or the insulating layer.

Figure 12:
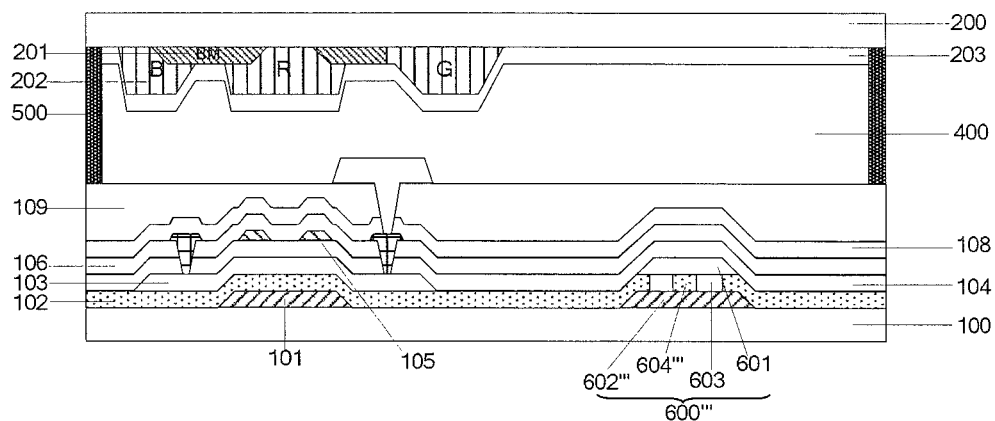
FIG. 12 is an illustrative structural drawing showing a display panel integrated with a pressure sensor according to a ninth exemplary embodiment of the invention.

FIG. 12 shows a display panel integrated with a pressure sensor according to another embodiment of the invention. As shown, the display panel is a LCD display panel, comprising a first substrate 100 and a second substrate 200; a metallic light-shielding layer 101, a buffer layer 102, a semiconductor material layer 103, a gate insulating layer 104, a gate 105, an interlayer insulating layer 106, a source/drain electrode layer 107, a protective passivation layer 108 and a planarization layer 109 may be formed successively on the first substrate 100; the semiconductor material layer 103, the gate insulating layer 104, the gate 105, the interlayer insulating layer 106 and the source/drain electrode layer 107 may constitute a TFT structure; the pixel electrode 111 is formed on the planarization layer 109 and electrically connected with a drain electrode of the TFT structure; a black matrix 201, a color filter layer 202 and the common electrode 203 may be formed successively on the second substrate 200, the common electrode 203 covering the black matrix 201 and the color filter layer 202; a liquid crystal layer 400 is arranged between the first and the second substrates and sealed between the common electrode 203 and the pixel electrode 111 by sealant 500.

As shown in FIG. 12, the display panel comprises a pressure sensor 600''' integrated on the first substrate 100, and the pressure sensor comprises a first electrode 601, a second electrode 602''', and at least one enclosed microcavity 603 between the first electrode 601 and the second electrode 602. Adjacent microcavities 603 may be separated by a cavity wall or partition wall 604''' disposed between the first electrode 601 and the second electrode 602'''. In the embodiment shown in FIG. 12, the first electrode 601 is formed of graphene, the second electrode 602''' and the metallic light-shielding layer 101 may be formed by the same material layer simultaneously, and the cavity wall or the partition wall 604''' may be formed by the material layer forming the buffer layer 102.

In an example, the cavity wall or the partition wall 604''' may be formed of at least one of a material forming an insulating layer included in the TFT structure (such as the gate insulating layer 104 and the interlayer insulating layer 106) and a material forming an insulating layer covering the TFT structure (such as the protective passivation layer 108 and the planarization layer 109), and may be formed simultaneously with a corresponding insulating layer. Through overlapping of a plurality of insulating layers, a height of the microcavity 603 may be increased.

According to another embodiment of the invention, there is provided a method of manufacturing a display panel integrated with a pressure sensor. Referring to FIGS. 5-12, the method may comprise the following steps of:

providing a substrate; and forming a pressure sensor on the substrate through a semiconductor process, the pressure sensor comprising a first electrode, a plurality of partition walls and a second electrode arranged successively on the substrate such that at least one enclosed microcavity is formed between the first electrode and the second electrode, wherein at least one of the first electrode and the second electrode is formed of graphene, and cavity walls of the microcavity are formed by the partition walls.

In an example, the first electrode and the metallic light-shielding layer may be formed by the same material layer simultaneously on the substrate. In another example, the step of forming the partition walls may comprise forming a buffer layer covering the metallic light-shielding layer and the first electrode, and patterning a portion of the buffering layer covering the first electrode to form at least one recessed cavity having an opening in the portion, and covering the opening with the second electrode to form the microcavity.

Alternatively, the method further comprises a step of forming a TFT structure and one or more insulating layers covering the TFT structure and the first electrode, wherein the step of forming the partition walls may comprise patterning a portion of at least one of the insulating layers covering the first electrode to form at least one recessed cavity having an opening in the portion, and covering the opening with the second electrode to form the microcavity.

Exemplarily, the partition walls may be formed of a resin material or a photoresist material through a patterning process. Alternatively, the method comprises forming a color filter layer and a black matrix layer on the pressure sensor, and the partition walls may be formed of one or more material layers forming the color filter layer and the black matrix layer through a patterning progress.

In an example, the method further comprise: forming an insulating layer covering the second electrode, the insulating layer being formed of one or more of materials that form the color filter layer and the black matrix layer; and forming a common electrode covering the color filter layer, the black matrix layer and the insulating layer. In another example, the second electrode and the common electrode of the display panel may be formed from the same electrically conductive layer on the substrate, or the second electrode and the common electrode overlap with each other.

Figure 13:
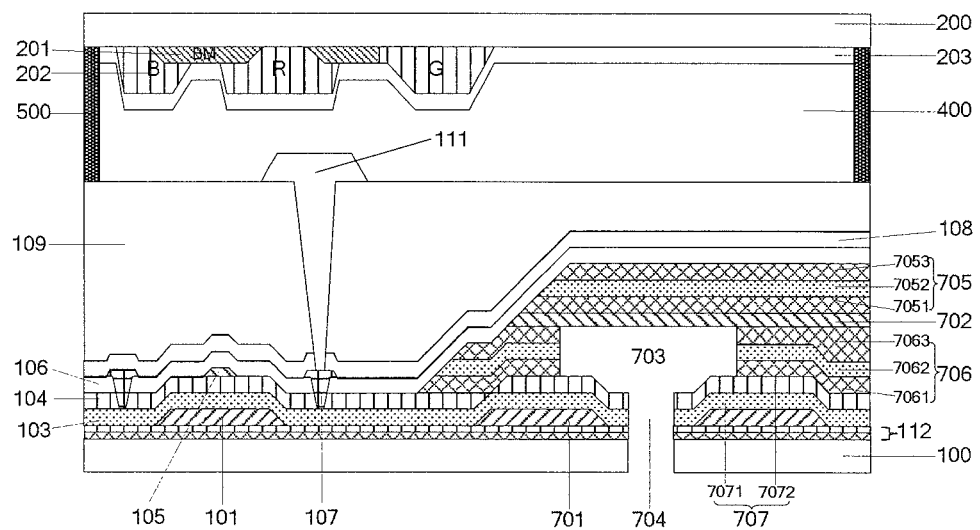
FIG. 13 is an illustrative structural drawing showing a display panel integrated with an acoustic sensor according to an eleventh exemplary embodiment of the invention.
Figure 14:
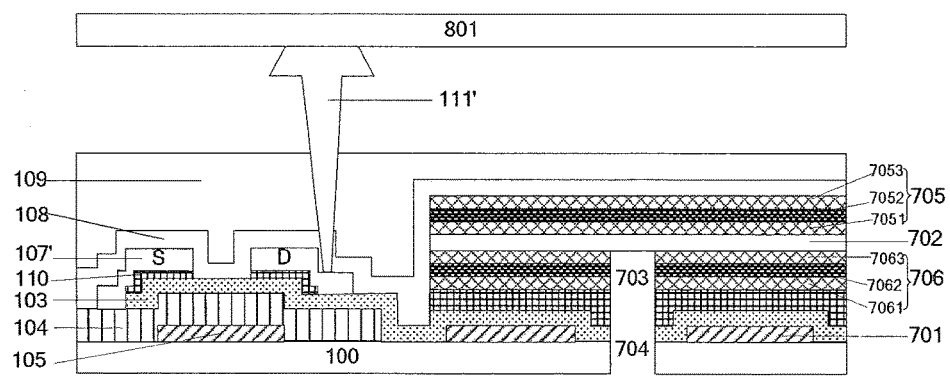
FIG. 14 is an illustrative structural drawing showing a display panel integrated with an acoustic sensor according to a twelfth exemplary embodiment of the invention.

According to a further aspect of the invention, there is provided a display panel integrated with an acoustic sensor through a semiconductor process. FIGS. 13 and 14 illustrate a structure of a display panel integrated with an acoustic sensor according to an exemplary embodiment of the invention.

In the embodiment shown in FIG. 13, the display panel is a LCD display panel, comprising a first substrate 100 and a second substrate 200; a metallic light-shielding layer 101, a semiconductor material layer 103, a gate insulating layer 104, a gate 105, an interlayer insulating layer 106, a source/drain electrode layer 107, a protective passivation layer 108 and a planarization layer 109 may be formed successively on the first substrate 100; a black matrix 201, a color filter layer 202 and a common substrate 203 covering the black matrix 201 and the color filter layer 202 may be formed successively on the second substrate 200; a liquid crystal layer 400 is arranged between the first and the second substrates and sealed between the common electrode 203 and the pixel electrode 111 by sealant 500. One or more insulating layers 112 are arranged between the first substrate 100 and the metallic light-shielding layer 101.

As shown in FIG. 13, an acoustic sensor is integrated on the first substrate 100 and comprises a first electrode 701, a second electrode 702, a back cavity 703 located between the first electrode 701 and the second electrode 702, a microhole 704 penetrating through the first substrate 100 and communicating the back cavity 703 with external environment, and an acoustic sensitive structure (or component) 705 arranged on the second electrode 702, the acoustic sensitive structure 705 being at least partially made from silicon.

With the above configuration, the first electrode 701, the second electrode 702 and the back cavity 703 constitute a capacitor. When external sound wave enters the back cavity 703 via the microhole 704 and causes a vibration or deformation of the acoustic sensitive structure 705, a distance between the first electrode 701 and the second electrode 702 changes, and in turn, a capacitance of the capacitor changes; the first electrode 701 and the second electrode 702 may sense the change of the capacitance and output an electric signal, so that a transition from acoustic signal to electric signal is achieved. The acoustic sensor may be used to sense sound waves from external environment.

In FIG. 13, the display panel comprises a top-gate type TFT structure constituted by the semiconductor material layer 103, the gate insulating layer 104, the gate 105, the interlayer insulating layer 106 and the source/drain electrode layer 107 overlapping with each other successively, wherein the first electrode 701 and the metallic light-shielding layer 101 may be formed by the same material layer simultaneously, the semiconductor material layer 103 and the gate insulating layer 104 may further successively cover the first electrode 701 and at least a portion of the gate insulating layer 104 faces the inside of the back cavity 703, and the second electrode 702 and the gate 105 may be formed by the same material layer simultaneously. The microhole 704 penetrates through the first substrate 100, the insulating layer 112, the semiconductor material layer 103 and the gate insulating layer 104, so as to communicate the back cavity 703 with external environment.

In the embodiment shown in FIG. 14, the display panel is an OLED display panel comprising a bottom-gate type TFT structure, the TFT structure comprises the gate 105, the gate insulating layer 104, the semiconductor material layer 103 and the source/drain electrode layer 107' arranged successively on the first substrate 100; a doped semiconductor material layer 110 may be further formed between the semiconductor material layer 103 and the source/drain electrode layer 107'; the first electrode 701 may be formed by the material layer forming the gate 105; the semiconductor material layer 103 and the doped semiconductor material layer 110 may also covers the first electrode 701 to define a portion of the microhole 704; the second electrode 702 and the source/drain electrode layer 107' may be formed by the same material layer; an anode 111' is connected between the a drain electrode of the TFT structure and a light-emitting layer 801. For example, the semiconductor material layer 103 may be made of a α-Si material, while the doped semiconductor material layer 110 is made of a n+α-Si material.

In the embodiments shown in FIGS. 13 and 14, the acoustic sensitive structure 705 may comprises a three-layer structure formed on the second electrode 702, the three-layer structure comprises an upper insulating material layer 7051, a lower insulating material layer 7053 and a silicon layer 7052 sandwiched between the upper insulating material layer 7051 and the lower insulating material layer 7053. As an example, the silicon layer 7052 may made of a P-type silicon material, the upper and the lower insulating material layers 7051, 7053 may be made of silicon oxide, silicon nitride or the like.

In an example, cavity wall(s) of the back cavity 703 may be at least partially formed of silicon. As shown in FIGS. 13 and 14, the cavity wall 706 of the back cavity 703 has a three-layer structure, which is formed on the doped semiconductor material layer 110 and comprises an insulating layer 7061, a silicon layer 7062 and an insulating layer 7063 overlapping with each other successively. For example, the silicon layer 7062 may be formed of a P-type silicon material, the insulating layers 7061, 7063 may be made of silicon oxide, silicon nitride or the like.

According to a further embodiment of the invention, there is provided a method of manufacturing a display panel integrated with an acoustic sensor. Referring to FIGS. 13 and 14, the method may comprise the following steps of:

providing a substrate; and forming a TFT structure and an acoustic sensor on the substrate through a semiconductor process, the acoustic sensor comprising a first electrode, a second electrode, a back cavity located between the first electrode and the second electrode, a microhole penetrating through the substrate and communicating the back cavity with external environment, and an acoustic sensitive structure arranged on the second electrode, the acoustic sensitive structure being at least partially made from silicon.

In an example, forming the TFT structure comprises forming a metallic light-shielding layer, a semiconductor material layer, a gate insulating layer, a gate, an interlayer insulating layer and a source/drain electrode layer successively on the substrate, wherein the first electrode and the metallic light-shielding layer may be formed by the same material layer simultaneously, the semiconductor material layer and the gate insulating layer may further successively cover the first electrode and at least a portion of the gate insulating layer faces the inside of the back cavity, and the second electrode and the gate may be formed by the same material layer simultaneously.

Alternatively, forming the TFT structure may comprises forming a gate, a gate insulating layer, a semiconductor material layer and a source/drain electrode layer successively on the substrate, wherein the first electrode may be formed by the material layer forming the gate, the semiconductor material layer may further cover the first electrode to define a portion of the microhole, and the second electrode and the source/drain electrode layer may be formed by the same material layer simultaneously.

According to a still further embodiment of the invention, there is provided a display device, which comprises the display panel according to any one of the above embodiments or the display panel manufactured through the above methods. The display device may comprise a liquid crystal display (LCD) device, such as a LCD television, a mobile phone, an electronic book, a tablet computer or the like, and it may also be an OLED display device.

In the display panels and manufacturing methods thereof and the display device comprising the display panel provided in the embodiments of the invention, the display panel comprises a substrate and sensor(s) integrated on the substrate, the sensor is integrated into the display panel through a semiconductor process that is at least partially synchronously performed with processes of forming the array substrate and/or color filter substrate of the display panel, an integration level of the sensor is thereby increased and the process is simplified. When various sensors, such as acceleration sensor, pressure sensor and acoustic sensor, are integrated into a display panel of a display device, it will be more convenient to use various applications utilizing the sensors. For example, an acceleration sensor may be used in applications such as step counting, switching screen rotation direction of a display device and the like, and it may also be used for functions such as monitoring vibrations during a camera shooting; when an acoustic sensor is integrated into a mobile terminal, it may be used to realize a speech input function of a microphone or to monitor ambient noise; or, when a pressure sensor is integrated in a mobile terminal, it may used for applications, such as, monitoring ambient pressure or height and the like.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A display panel, comprising:
a first substrate;
a second substrate disposed facing the first substrate; and
at least one sensor integrated between the first substrate and the second substrate,
wherein the sensor comprises an acceleration sensor comprising:
a first electrode formed on the first substrate;
a second electrode formed on the second substrate;
an enclosing wall disposed between the first substrate and the second substrate, an enclosed cavity being defined by the enclosing wall, the first electrode and the second electrode;
a mass block disposed in the enclosed cavity to divide the enclosed cavity into a first cavity and a second cavity that are isolated from each other, the mass block being able to move between the first substrate and the second substrate along the enclosing wall to change volumes of the first cavity and the second cavity; and
a first fluid and a second fluid filled in the first cavity and the second cavity respectively, so as to allow the mass block to move freely within the enclosed cavity.

2. The display panel according to claim 1, wherein:
the display panel is a liquid crystal display panel comprising a pixel electrode formed on the first substrate and a common electrode formed on the second substrate, the first electrode and the pixel electrode being formed by the same electrically conductive layer, and the second electrode and the common electrode being formed by the same electrically conductive layer; or
the display panel is an OLED display panel comprising an anode formed on the first substrate and a cathode formed close to the second substrate, the first electrode and the anode being formed by the same electrically conductive layer, and the second electrode and the cathode being formed by the same electrically conductive layer.

3. The display panel according to claim 2, wherein an inner surface of the enclosing wall is provided with a guiding rail and the mass block is configured to be movable within the enclosed cavity along the guiding rail.

4. The display panel according to claim 2, wherein at least one of the enclosing wall and the mass block is provided with a position detecting structure for detecting a position of the mass block within the enclosed cavity.

5. A display device, comprising the display panel according to claim 1.

6. A display panel, comprising:
a first substrate;
a second substrate disposed facing the first substrate; and
at least one sensor integrated between the first substrate and the second substrate,
wherein the sensor comprises a pressure sensor comprising a first electrode formed on the first substrate, a second electrode facing the first electrode and a partition wall disposed between the first electrode and the second electrode; and
wherein at least one enclosed microcavity is defined by the first electrode, the second electrode, and the partition wall, and at least one of the first electrode and the second electrode is formed of graphene.

7. The display panel according to claim 6, wherein:
the display panel further comprises a metallic light-shielding layer formed on the first substrate and a buffer layer covering the metallic light-shielding layer;
the first electrode is formed of graphene;
the second electrode and the metallic light-shielding layer are formed by the same material layer; and
the partition wall is formed by a material layer forming the buffer layer.

8. The display panel according to claim 6, wherein the display panel further comprises a TFT structure formed on the first substrate and one or more insulating material layers covering the TFT structure, and
wherein the partition wall is formed by at least one insulating material layer of the one or more insulating material layers; and
wherein the one or more insulating material layers comprise at least one of an interlayer insulating layer, a protective passivation layer and a planarization layer.

9. The display panel according to claim 6, wherein the display panel further comprises a color filter layer and a black matrix layer formed on the second substrate, and
wherein the pressure sensor is located between the second substrate and the color filter layer, and between the second substrate and the black matrix layer.

10. The display panel according to claim 9, wherein the partition wall is formed of a photoresist material through a patterning process.

11. The display panel according to claim 9, wherein the partition wall is formed by one or more of material layers forming the color filter layer and the black matrix layer through a patterning process.

12. The display panel according to claim 9, wherein the display panel further comprises a common electrode covering the color filter layer and the black matrix layer, the first electrode being formed on a surface of the second substrate, and the second electrode being electrically insulated from the common electrode by an insulating layer formed by one or more of materials forming the color filter layer and the black matrix layer.

13. The display panel according to claim 9, wherein the display panel further comprises a common electrode covering the color filter layer and the black matrix layer, the first electrode being formed on a surface of the second substrate, and the second electrode and the common electrode being formed by the same electrically conductive layer.

14. A display device, comprising the display panel according to claim 6.

15. A display panel, comprising:
a first substrate;
a second substrate disposed facing the first substrate; and
at least one sensor integrated between the first substrate and the second substrate,
wherein the sensor comprises an acoustic sensor comprising a first electrode formed on the first substrate, a second electrode facing the first electrode, a back cavity located between the first electrode and the second electrode, a microhole penetrating through the first substrate and communicating the back cavity with external environment, and an acoustic sensitive structure arranged on the second electrode, the acoustic sensitive structure being at least partially made from silicon.

16. The display panel according to claim 15, wherein the display panel further comprises a metallic light-shielding layer formed on the first substrate and a top-gate type TFT structure formed on the metallic light-shielding layer, wherein top-gate type TFT structure comprises a semiconductor material layer, a gate insulating layer and a gate that are formed successively on the metallic light-shielding layer, and wherein the first electrode and the metallic light-shielding layer are formed by the same material layer, the semiconductor material layer and the gate insulating layer further cover the first electrode successively, at least a portion of the gate insulating layer faces the inside of the back cavity, and the second electrode and the gate are formed by the same material layer.

17. The display panel according to claim 15, wherein the display panel further comprises a bottom-gate type TFT structure formed on the first substrate, the bottom-gate type TFT structure comprising a gate, a gate insulating layer, semiconductor material layer and a source/drain electrode layer that are formed successively on the first substrate, and wherein the first electrode and the gate are formed by the same material layer, the semiconductor material layer further covers the first electrode, and the second electrode and the source/drain electrode layer are formed by the same material layer.

18. The display panel according to claim 15, wherein the acoustic sensitive structure comprises an upper insulating material layer, a lower insulating material layer facing the upper insulating material layer, and a silicon layer sandwiched between the upper insulating material layer and the lower insulating material layer.

19. The display panel according to claim 15, wherein the display panel further comprises a cavity wall located between the first electrode and the second electrode, the back cavity being defined by the cavity wall, the first electrode and the second electrode, and the cavity wall being at least partially formed of silicon.

20. A display device, comprising the display panel according to claim 15.

* * * * *